United States Patent
Authement et al.

(10) Patent No.: US 9,501,591 B2
(45) Date of Patent: Nov. 22, 2016

(54) DYNAMICALLY MODIFIABLE COMPONENT MODEL

(71) Applicant: INTERNATIONAL BUSINESS MACHINES CORPORATION, Armonk, NY (US)

(72) Inventors: Shawn P. Authement, Round Rock, TX (US); Kevin A. Bosien, Richmond, TX (US); David S. Drinnan, Houston, TX (US); Franck Excoffier, Katy, TX (US); Nhan Q. Vo, Cypress, TX (US); Andrew D. Walls, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 427 days.

(21) Appl. No.: 14/100,091

(22) Filed: Dec. 9, 2013

(65) Prior Publication Data

US 2015/0160955 A1   Jun. 11, 2015

(51) Int. Cl.
*G06F 9/455* (2006.01)
*G06F 17/50* (2006.01)
*G06F 11/36* (2006.01)

(52) U.S. Cl.
CPC ........... *G06F 17/5027* (2013.01); *G06F 11/36* (2013.01)

(58) Field of Classification Search
CPC ............................ G06F 17/5027; G06F 11/36
See application file for complete search history.

(56) References Cited

U.S. PATENT DOCUMENTS

| | | | |
|---|---|---|---|
| 4,399,503 A | 8/1983 | Hawley | |
| 5,056,015 A | 10/1991 | Baldwin et al. | |
| 5,301,100 A * | 4/1994 | Wagner | G05B 19/0426 700/19 |
| 5,321,828 A | 6/1994 | Phillips et al. | |
| 5,381,540 A | 1/1995 | Adams et al. | |
| 5,386,518 A * | 1/1995 | Reagle | G06F 13/385 710/316 |
| 5,796,994 A * | 8/1998 | Chambers | G06F 7/00 713/500 |
| 6,212,625 B1 * | 4/2001 | Russell | G05B 19/042 710/19 |
| 6,473,763 B1 * | 10/2002 | Corl, Jr. | G06F 17/30985 |
| 7,356,721 B2 | 4/2008 | Taguchi et al. | |
| 7,415,020 B2 * | 8/2008 | Joung | H04L 45/02 370/386 |
| 7,774,560 B2 * | 8/2010 | Liu | G06F 3/0607 703/23 |
| 7,962,659 B2 | 6/2011 | Mann | |
| 7,978,709 B1 * | 7/2011 | Venkatachary | H04L 45/00 370/395.32 |
| 7,987,086 B2 | 7/2011 | Van Huben et al. | |
| 8,296,718 B2 | 10/2012 | Appleyard et al. | |

(Continued)

OTHER PUBLICATIONS

Peter D. Minns et al., "FSM-based Digital Design using Verilog HDL," 2008, John Wiley & Sons, 22 pages.*

(Continued)

*Primary Examiner* — Aniss Chad
*Assistant Examiner* — Russ Guill
(74) *Attorney, Agent, or Firm* — Brian F. Russell; Randall J. Bluestone

(57) ABSTRACT

To emulate a hardware component of a target hardware system including a plurality of hardware components, a component model of the hardware component is built, where the component model includes a register interface through which a host application provides inputs to and reads outputs from the component model, one or more parameter registers that hold values of state variables of the component model, and a state machine that models behavior of the hardware component without explicitly emulating logic implemented in the hardware component. During modeling of the hardware component utilizing the component model the component model is dynamically modified other than by modifying values of the state variables.

15 Claims, 8 Drawing Sheets

(56) References Cited

U.S. PATENT DOCUMENTS

| | | | |
|---|---|---|---|
| 2001/0014936 A1* | 8/2001 | Jinzaki | G06F 9/22 711/221 |
| 2004/0093589 A1* | 5/2004 | Master | G06F 17/5022 717/136 |
| 2004/0239366 A1* | 12/2004 | Schlipf | G05B 19/045 326/46 |
| 2006/0277027 A1 | 12/2006 | Mann et al. | |
| 2008/0164908 A1* | 7/2008 | Challenger | G06F 9/4436 326/46 |
| 2012/0191967 A1* | 7/2012 | Lin | G06F 17/16 713/100 |
| 2013/0138593 A1* | 5/2013 | Miller | G06N 5/02 706/46 |

OTHER PUBLICATIONS

Jan van Lunteren et al., "Fast and Scalable Packet Classification," 2003, IEEE Journal on Selected Areas in Communications, vol. 21, No. 4, pp. 560-570.*

Pankaj Gupta et al., "Algorithms for Packet Classification," 2001, IEEE Network, March/April, pp. 24-32.*

David E. Taylor, "Survey and taxonomy of packet classification techniques," 2005, ACM Computing Surveys, vol. 37, No. 3, pp. 238-275.*

Leveugle. R., "Multi-Level Fault Injections in VHDL Descriptions: Alternative Approaches and Experiments", Journal of Electronic Testing: Theory and Applications 19, 559-575, Nov. 24, 2002.

* cited by examiner

DYNAMICALLY MODIFIABLE COMPONENT MODEL

BACKGROUND OF THE INVENTION

This disclosure relates in general to data processing, and more specifically, to emulation of a target hardware system.

A well known technique for developing a target hardware system and/or modeling its behavior is to emulate the target hardware system through the execution of software on a host hardware platform. Conventional emulation techniques require the full emulation of each hardware component in the target hardware system. Because conventional emulation techniques require execution of both the full software stack and an emulated hardware stack below it, each emulated component necessarily consumes more raw processing power than its physical counterpart. Consequently, emulation of a target hardware systems of significant scale (i.e., those with multiple intelligent hardware components managed by one or more management components) can be impractical on many host hardware platforms due to processing resource constraints.

Further, in even cases in which sufficient processing resources are available to perform a full emulation of each hardware component of the target hardware system, in many cases, emulation code that mimics the internal operation of each hardware component may not be readily available or easily developed. The present disclosure appreciates, however, that even in cases in which the internal operation of a hardware component is difficult to model, interfaces to the hardware components are frequently visible and well defined.

For emulation to be helpful, the emulator should be able to quickly and consistently produce a known state of the target hardware system. With conventional emulation techniques, replication of a known state in the emulator may entail creating an extensive litany of internal operations and/or user inputs performed on the target hardware system to achieve the known state. For so-called "corner" cases, a known state (e.g., a particular failure state) may only be reached after months of compounding problems or human actions in the target hardware system, which may provide insufficient logging to recreate the known state in the emulator.

The present disclosure further appreciates that it would be desirable for a user of the emulator should be able to introduce faults, change behaviors, or modify both software and hardware components in a way that does not require disruption of the emulation. In the case of emulated hardware components without a user interface, modification of the behavior of the emulator components may not be possible using conventional emulation techniques. For emulated hardware components that support user-level interaction, conventional emulation techniques only permit the emulated hardware component to be configured through the user interface, which artificially limits flexibility because user interfaces are typically designed to restrict the user from performing certain operations (e.g., invalid operations) in order to minimize errors.

BRIEF SUMMARY

In at least one embodiment, a hierarchical data structure in a data storage system, such as a file system or database, is utilized to organize a hierarchical arrangement of device containers corresponding to various device identifiers of the plurality of hardware components in the target hardware system, scripts corresponding to various packet types of communication packets in the target hardware system, and responses corresponding to various packet data in the communication packets in the target hardware system. In response to receipt by a hierarchical emulation engine of a communication packet during emulation of the target hardware system, the communication packet including a device identifier, packet type and packet data, a response to the communication packet is determined by traversing the hierarchical arrangement based on the device identifier, packet type and packet data of the communication packet. The determined response is then provided.

In at least one embodiment, to emulate a hardware component of a target hardware system including a plurality of hardware components, a component model of the hardware component is built, where the component model includes a register interface through which a host application provides inputs to and reads outputs from the component model, one or more parameter registers that hold values of state variables of the component model, and a state machine that models behavior of the hardware component without explicitly emulating logic implemented in the hardware component. During modeling of the hardware component utilizing the component model the component model is dynamically modified other than by modifying values of the state variables.

BRIEF DESCRIPTION OF THE SEVERAL VIEWS OF THE DRAWINGS

FIG. 7 illustrates a block diagram of an exemplary development environment 700 in accordance with one embodiment;

DETAILED DESCRIPTION

Figure 1:
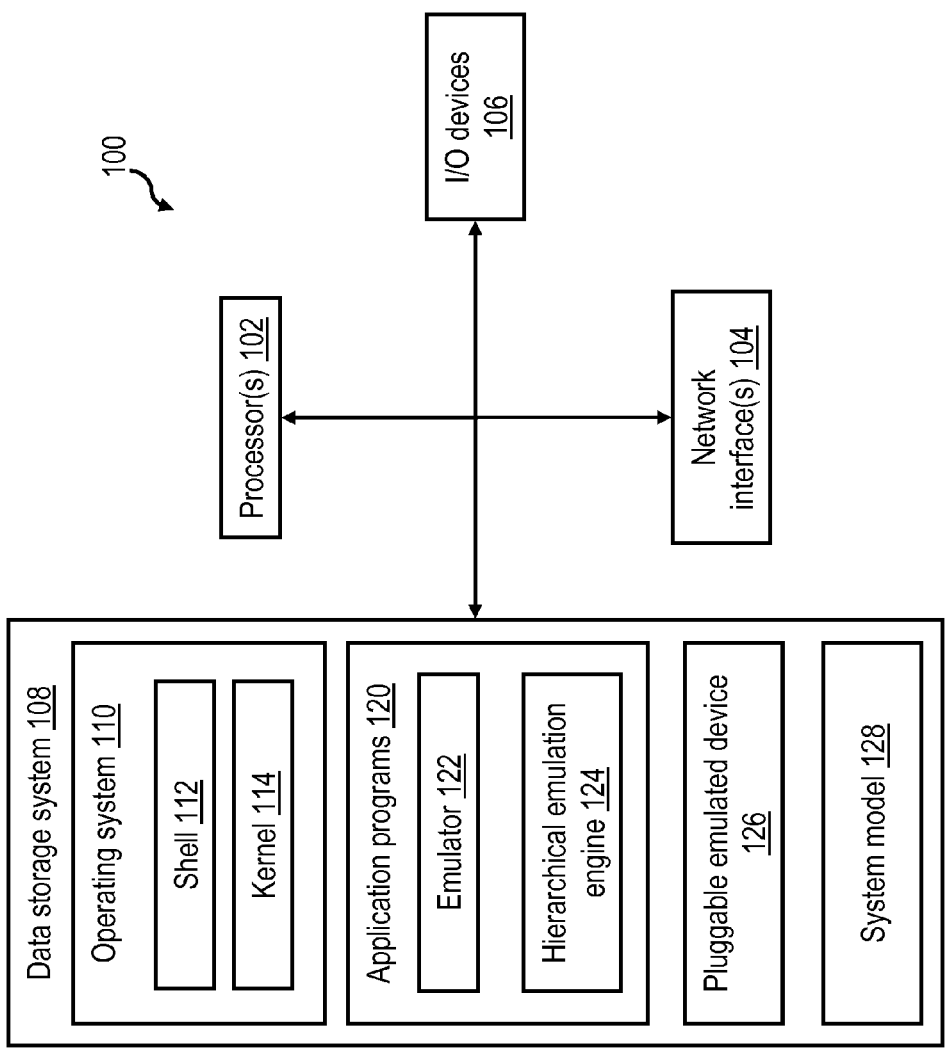
FIG. 1 is a high level block diagram of an exemplary data processing system that may be employed to emulate a target hardware system utilizing the techniques disclosed herein.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

With reference now to the figures and in particular with reference to FIG. 1, there is depicted a block diagram of an exemplary data processing system 100 that may be employed to emulate a target hardware system utilizing the emulation techniques disclosed herein. In various embodiments, data processing system 100 may be, for example, a mainframe computer system, a server computer system (or processing node thereof), a desktop computer system, or a laptop, tablet or other portable computer system.

Figure 2:
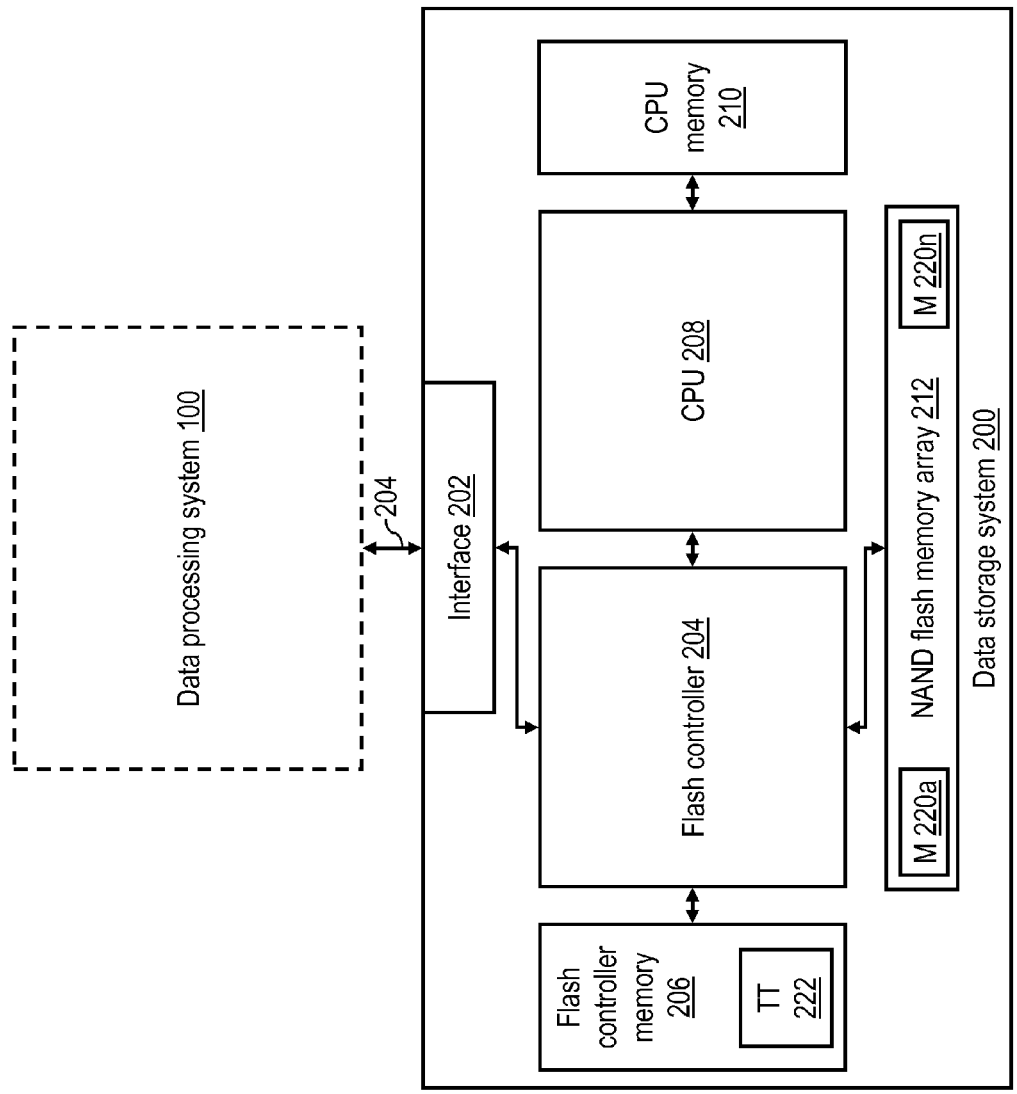
FIG. 2 is a high level block diagram of an exemplary data storage system that may be selected as a target hardware system to be emulated by the emulation engine of FIG. 1.

In the illustrated embodiment, data processing system 100 includes one or more processors 104 that manage, access, modify, execute and/or manipulate program code (e.g., software instructions) and/or data. Processors 102 are coupled, either directly or via one or more intermediate components such as buses and/or bridges, to one or more network interfaces 104. Network interface(s) 104, which can include, for example, network interface cards (NICs), converged network adapters (CNAs), wireless adapters, storage system controllers, etc., provide one or more interfaces by which data processing system 100 communicates with external networks and/or systems. The external systems coupled to data processing system 100 via network interface(s) 104 can include, for example, other data processing systems (e.g., peer systems, client systems, or server systems) or data storage systems. One exemplary data storage system that may be utilized in combination with a data processing system such as data processing system 100 of FIG. 1 is depicted in FIG. 2.

Data processing system 100 additionally includes input/output (I/O) devices 106 coupled to processor(s) 102. These I/O devices 106 can include ports, displays, user input devices and attached devices, etc., which receive inputs and provide outputs of the processing performed by data processing system 100 and/or other external resource(s) coupled to data processing system 100. Finally, data processing system 100 includes a local data storage system 108, which may include one or more volatile or non-volatile storage devices, including memories, solid state drives, optical or magnetic disk drives, tape drives, etc.

In the illustrated embodiment, data storage system 108 stores program code (including software, firmware or a combination thereof) and data that can be processed by processor(s) 102. The program code that populates data storage system 108 includes an operating system (OS) 110, such as Windows®, UNIX®, AIX or Linux, that manages the resources of data processing system 100. In at least some embodiments, OS 110 includes a shell 140 (as it is called in UNIX®) for providing a command interpreter and a user interface to the resources of data processing system 100. OS 110 also includes kernel 114, which provides services to application programs as well as lower level management functions, such as memory management, process and task management, device and file system management, and mouse and keyboard management.

Data storage system 108 additionally stores one or more application programs 120 that run on top of operating system 110. In the illustrated embodiment, these application programs 120 include an emulator 122 that provides full emulation of the internal states, processing and communication of a selected hardware component (e.g., a management component) of a target hardware system. The selected hardware component is represented in data storage system 108 by pluggable emulated device 126. In some embodiments, emulator 122 may be a conventional emulator, such as QEMU (Quick EMUlator).

Application programs 120 further include a hierarchical emulation engine 124 that emulates communication between the hardware component emulated by emulator 121 (i.e., pluggable emulated device 126) and other hardware components of the target hardware system. Data (including state data) and program code representing the target hardware system can be stored within data storage system 108 as a system model 124. In one preferred embodiment discussed in greater detail below, system model 124 has a hierarchical architecture that leverages the existing hierarchical structure of the file system implemented by kernel 114 in order to organize its constituent components. In a preferred embodiment, hierarchical emulation engine 124 may thus be implemented as a script that can interpret a generic file system storage hierarchy.

The hardware and software components of data processing system 100 depicted in FIG. 1 are not intended to be exhaustive, but rather represent and/or highlight certain components that may be utilized to practice the disclosed embodiments. Accordingly, those skilled in the art will appreciate that additional or alternative components may be employed in data processing system 100 within the spirit and scope of the appended claims.

Referring now to FIG. 2, there is depicted a high level block diagram of an exemplary data storage system 200 that may be selected as a target hardware system to be emulated by hierarchical emulation engine 124 of FIG. 1. As shown, data storage system 200 includes an interface 202 through which data storage system 200 communicates with other systems, such as data processing system 100, via an I/O channel 204. In various embodiments, I/O channel 204 may employ any one or a combination of known or future developed communication protocols, including, for example, Fibre Channel (FC), FC over Ethernet (FCoE), Internet Small Computer System Interface (iSCSI), Transport Control Protocol/Internet Protocol (TCP/IP), etc. I/O operations (IOPs) communicated via I/O channel 110 include read IOPs requesting data from data storage system 200 and write IOPs requesting storage of data in data storage system 200.

Interface 202 is coupled to a flash controller 204 (e.g., an Application Specific Integrated Circuit (ASIC) or Field Programmable Gate Array (FPGA)) having an associated flash controller memory 206 (e.g., Dynamic Random Access Memory (DRAM)). Flash controller 124 is additionally coupled to a CPU 208 having an associated CPU memory 210 (e.g., DRAM) and further coupled to a NAND flash memory array 140. NAND flash memory array 140 includes multiple flash memory modules 220a-220n, which in at least some embodiments comprise intelligent subsystems capable of self-managing and making autonomous decisions based on their internal states.

In embodiments in which flash controller 204 is implemented with an FPGA, CPU 208 may program and configure flash controller 204 during start-up of data storage system 200. After startup, in general operation flash controller 204 receives read and write IOPs via I/O channel 204 and interface 202 to read data stored in NAND flash memory array 212 and/or to store data in NAND flash memory array 212. Flash controller 204 services these IOPs, for example, by accessing NAND flash memory array 212 to read or write the requested data from or into NAND flash memory array 212 or by accessing a memory cache (not illustrated) associated with NAND flash memory array 212.

Flash controller 124 implements a flash translation layer that provides logical-to-physical address translation to enable access to specific memory locations within NAND flash memory array 212. In general, an IOP received by flash controller 212 from a host device, such as data processing system 100, contains the logical block address (LBA) at which the data is to be accessed (read or written) and, if a write IOP, the write data to be stored to data storage system 200. The IOP may also specify the amount (or size) of the data to be accessed. The flash translation layer translates this LBA into a physical address assigned to a corresponding physical location in NAND flash memory array 212. Flash controller 124 may perform address translation and/or store mappings between logical and physical addresses in a logical-to-physical translation data structure, such as translation table 222, which may conveniently be stored in flash controller memory 206.

Figure 3:
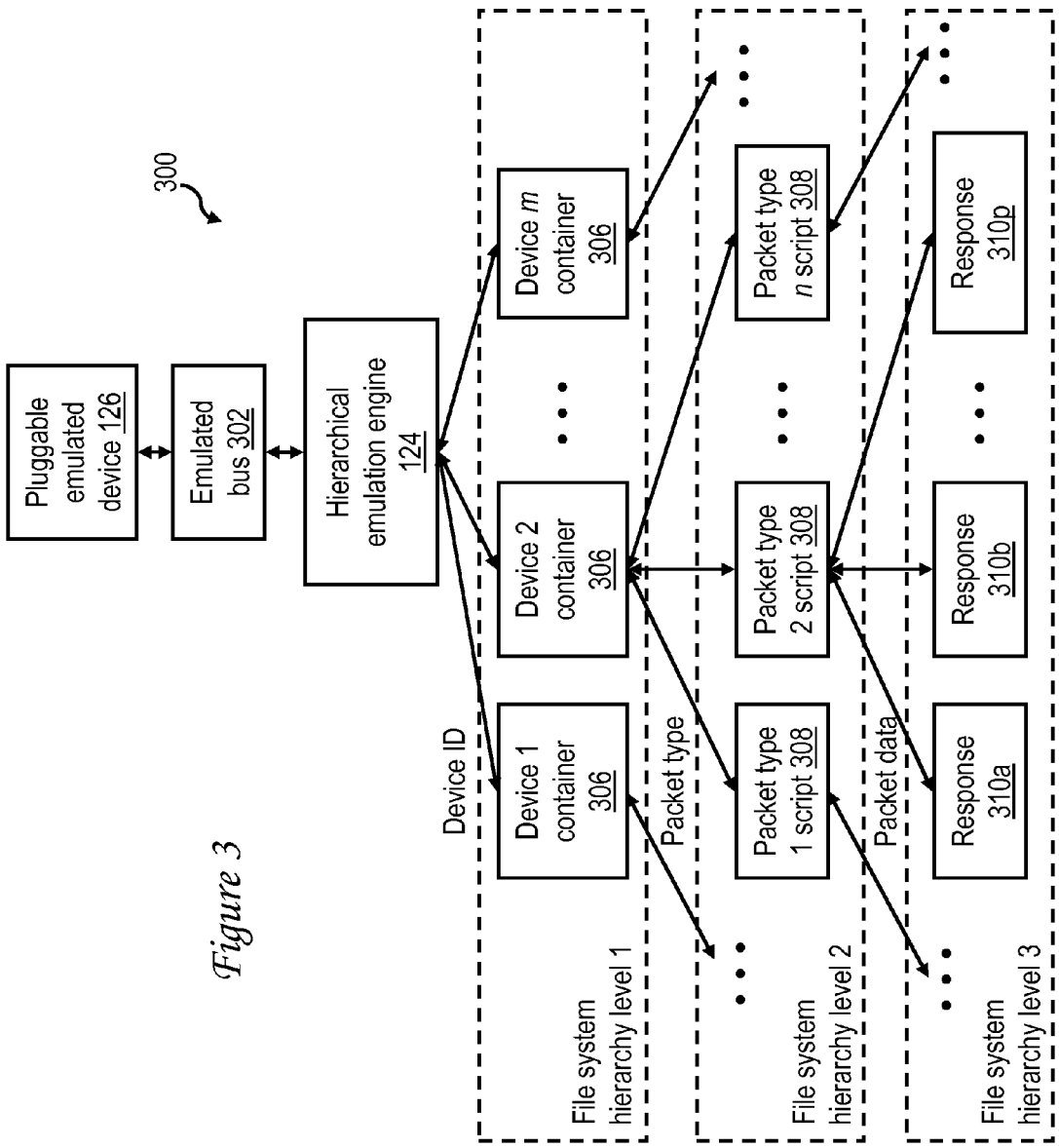
FIG. 3 illustrates an exemplary hierarchical emulation architecture in accordance with one embodiment.

With reference to FIG. 3, there is illustrated an exemplary hierarchical emulation architecture 300 in accordance with one embodiment. In contrast to conventional emulation environments in which each hardware component of the target hardware system and its associated states, communication and functionality are all full emulated, the exemplary hierarchical emulation architecture 300 of FIG. 3 focuses on emulating the communication between a fully emulated pluggable emulated device 126 and other hardware components of target hardware system.

In the exemplary hierarchical emulation architecture 300, a perspective for the emulation is selected, as represented by selection of one of the components of the target hardware system as a component to be fully emulated as pluggable emulated device 126. In general, it is preferred (but not required) for the hardware component that is selected for emulation by pluggable emulated device 126 to be a management component that jointly or solely manages some or all of the other hardware components of the target hardware system. For example, if data storage system 200 of FIG. 2 (or an enhanced version thereof that is under development) is selected as the target hardware platform, flash controller 204 can be selected as the hardware component emulated by pluggable emulated device 126.

As noted above, in at least some embodiments, pluggable emulated device 126 is emulated utilizing conventional emulation techniques. For example, in one embodiment pluggable emulated device 126 can be emulated utilizing QEMU, which can be executed by a process of OS 110.

Pluggable emulated device 126 communicates with hierarchical emulation engine 124 via an emulated bus 302.

Emulated bus 302 corresponds to a physical interface of the target hardware system through which the hardware component modeled by pluggable emulated device 126 exchanges messages with other hardware components of the target hardware system (e.g., the managed components). Emulated bus 302 may be implemented for example, using inter-process communication (IPC) between the process running emulator 122 and the process running hierarchical emulation engine 124.

Figure 4:
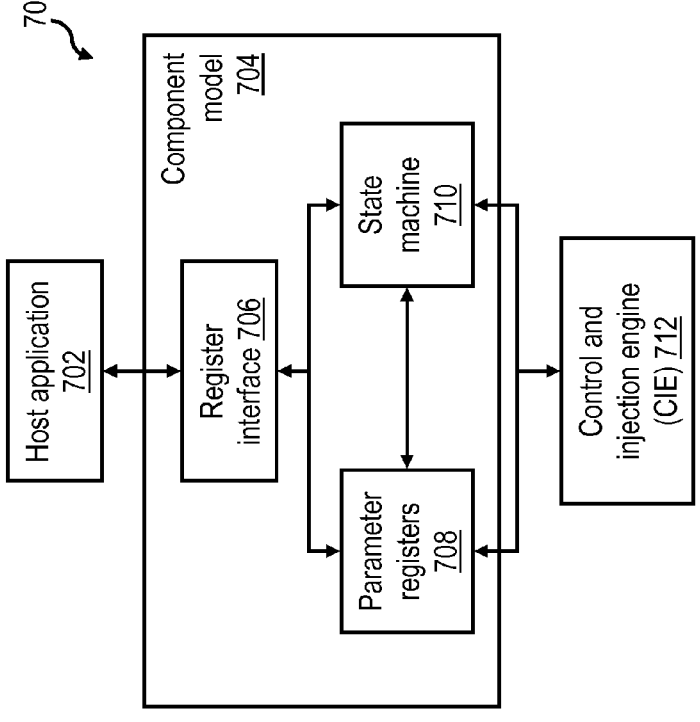
FIG. 4 depicts an exemplary packet format of messages exchanged between the pluggable emulated device and the hierarchical emulation engine in FIG. 3.

In at least some embodiments, the messages transmitted by pluggable emulated device 126 may take the generalized packet format depicted in FIG. 4. As shown, an exemplary communication packet 400 sent via emulated bus 302 may include a device identifier field 402 that specifies one or more hardware components of the target hardware system that are the intended recipient(s) of communication packet 400. In addition, communication packet 400 may includes a packet type field 404 indicating a packet type of communication packet 400 and a packet data field 406 containing packet data, if any. Responses provided by hierarchical emulation engine 124 to pluggable emulated device 126 via emulated bus 302 on behalf of the emulated hardware components of the target hardware system may employ the same, a similar or a different format than communication packet 400.

The hardware components of hierarchical emulation architecture 300 with which emulated bus 302 can communicate are each represented in hierarchical emulation architecture 300 by a respective one of device containers 306. As shown, device containers 306, which are each implemented with a file system construct such as a directory, folder or other file system construct, are preferably each associated by the file system with a corresponding hardware component of the target hardware system by the component's device ID. Device containers 306 preferably (but not necessarily) all reside at a common level of hierarchy of the file system implemented by operating system 110, arbitrarily designated in FIG. 3 as file system hierarchy level 1.

As shown, each device container 306 contains or is otherwise associated by the file system (e.g., by a directory, folder, or other file system construct) with a set of scripts 308 executable by processors 102. Each of the scripts preferably corresponds to and is associated by the file system with a respective packet type that can be received from emulated component 302 by the hardware component corresponding to the enclosing device container 306. For example, a packet of type 1 that can be received by device 2 is associated by the file system with packet type 1 script 308, a packet of type 2 that can be received by device 2 is associated by the file system with packet type 2 script 308, etc. It should be appreciated that at least some of the containers 306 will contain different scripts and different numbers of scripts. Again, the sets of scripts of all of the hardware devices are preferably (but not necessarily) stored at a common hierarchy level of the operating system's file system, such as file system hierarchy level 2.

FIG. 3 further illustrates that each script 308 is associated by the file system (e.g., by directory, folder, or other file system construct) with a set of responses to the type of communication packet corresponding to the associated script. For example, FIG. 3 illustrates that packet type 2 script 308 has an associated set of responses including responses 310a-310p. Each response is preferably associated by the file system with corresponding packet data. The sets of responses associated with all the scripts are preferably (but not necessarily) stored at a common hierarchy level of the operating system's file system, such as file system hierarchy level 3. It should be appreciated that file system hierarchy levels 1, 2 and 3 can be, but need not be, consecutive levels of hierarchy.

Although FIG. 3 illustrates an exemplary hierarchical emulation architecture 300 in which the hierarchy of devices, packet types and responses is organized by employing the hierarchical structure inherent in an operating system's file system, the disclosed hierarchical emulation engine 124 can alternatively organize these elements via other hierarchical data structures. For example, in one alternative embodiment, a standard database (such as SQL) can be populated with static variables. Hierarchical emulation engine 124 can, instead of traversing a file system directory, perform an SQL SELECT query against the database to retrieve the correct response.

Figure 5:
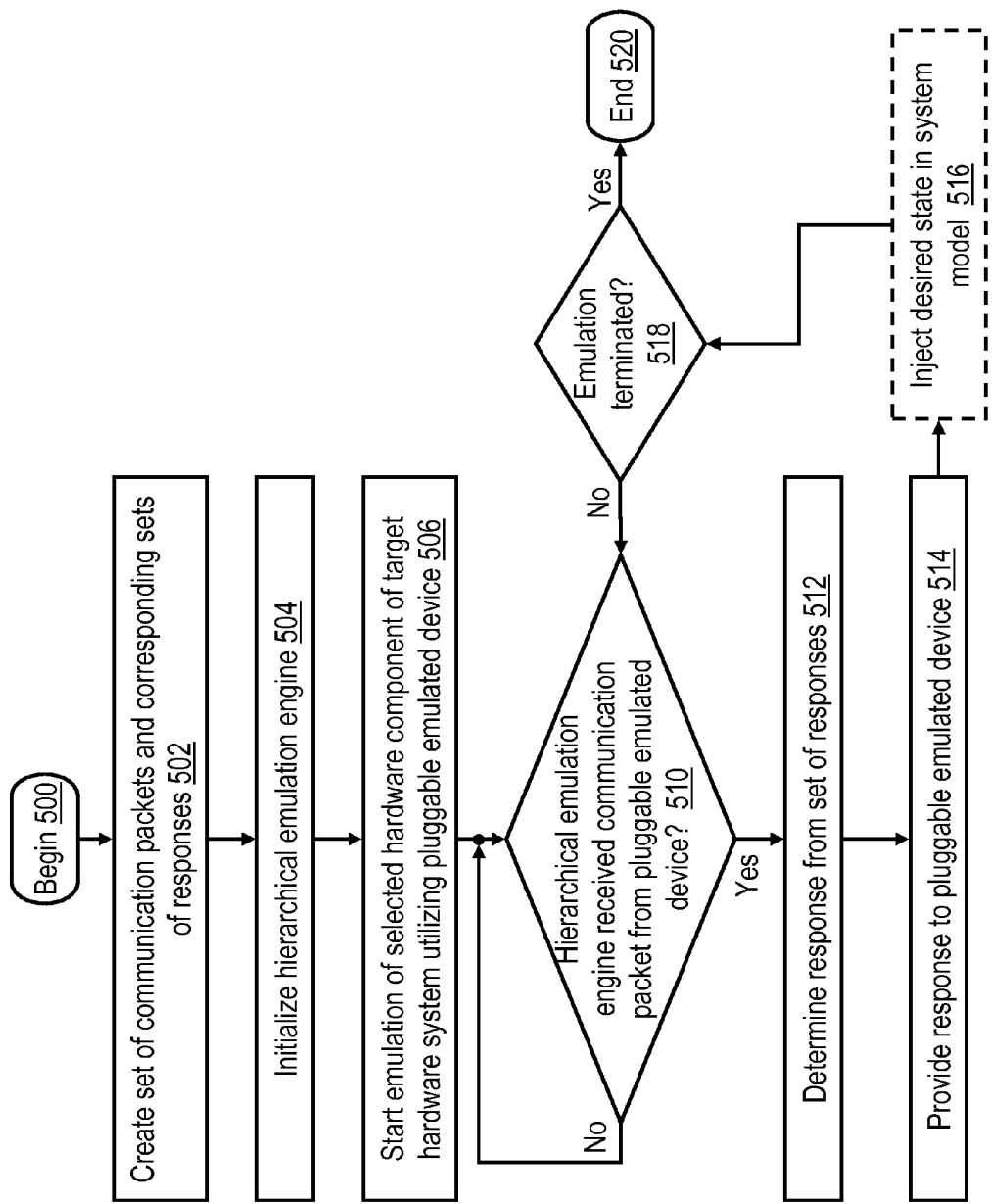
FIG. 5 is a high level logical flowchart of an exemplary method of emulation utilizing the hierarchical emulation architecture of FIG. 3 in accordance with one embodiment.

With reference now to FIG. 5, there is illustrated a high level logical flowchart of an exemplary method of emulation utilizing the hierarchical emulation architecture 300 of FIG. 3 in accordance with one embodiment. As with the other logical flowchart(s) illustrated herein, FIG. 5 depicts operations in a logical rather than strictly chronological order, and in some embodiments, operations may be performed in a different order than illustrated or concurrently. In at least some embodiments, the illustrated process can be performed by data processing system 100 through the execution of emulator 122 and hierarchical emulation engine 124 in two processes.

The method depicted in FIG. 5 begins at block 500 and thereafter proceeds to block 502, which illustrates creating a set of communication packets that can be transmitted by the hardware component of the target hardware system modeled by pluggable emulated device 126 and a corresponding set of responses for each communication packet. For example, for a target hardware system under development, the set of communication packets and the sets of responses can be defined by developers and stored in a file. Alternatively or additionally, the set of communication packets and the sets of responses can be gathered from a physical implementation of the target hardware system by taking "snapshots" of the system. That is, diagnostic tools can be utilized to both send communication packet to the target hardware system (and individual hardware components thereof) and report responses. A script can additionally interpret user input (through a file or other method) to determine every possible communication packet that can be transmitted in the target hardware system and to record (e.g., in a file) each communication packet and its associated response(s).

At block 504, hierarchical emulation engine 124 is initialized. For example, in one embodiment, during the initialization process hierarchical emulation engine 124 reads and interprets the file containing the communication packets and responses created at block 502 and builds the hierarchical emulation architecture 300 shown in FIG. 3. Hierarchical emulation engine 124 interprets and correlates each message with a particular hardware device based on the device identifiers specified in the device identifier fields 402 of the communication packets. Hierarchical emulation engine 124 then extracts the packet data from the packet data fields 406 of the communication packets and stores the data under the file system hierarchy. The data can be stored, for example, in a file or other container that will be persistent across multiple independent processes that are likely not known at the time of initialization. If necessary, hierarchical emulation engine 124 then modifies each of these data files to update the hardware mapping to account for variables or data that are different between system model 128 and the target hardware system. This modification allows different but similar systems to be interchangeable.

Thus, for example, this modification permits emulation of different generations of technology, such as an older 24 nm flash SSD or a newer 19 nm SSD. As another example, such modifications can also permit emulation of FibreChannel and InfiniBand adapters interchangeably. These components, which are quite similar in their operation, are equivalently substitutable in the hierarchical emulation. Once a model for one device is created, substantive portions of that model can be re-used to emulate one or more other similar devices. Consequently, unlike traditional emulation that generally requires even like devices to have fully working independent emulators; the described technique allows a substantive model to be used for multiple different devices.

At block 506, emulation by emulator 122 of a selected hardware component of the target hardware system utilizing pluggable emulated device 126 is initiated on data processing system 100. As noted above, emulator 122 preferably fully models the internal states, internal processing and communication of the selected hardware component of the target hardware system. During the emulation, hierarchical emulation engine 124 monitors for any communication packets transmitted by pluggable emulated device 126 on emulated bus 302 (block 510). Other than the minimal monitoring shown at block 510 (and that discussed below at block 516), hierarchical emulation engine 124 is preferably inactive during emulation unless and until a communication packet is detected, thus conserving processing resources of data processing system 100 and increasing the scale of target hardware system that can be effectively emulated.

In response to detection of a communication packet transmitted by pluggable emulated device 126, hierarchical emulation engine 124 causes an appropriate response to the communication packet to be determined and provided to pluggable emulated device 126 via emulated bus 302, as shown at blocks 512-514. In a preferred embodiment, hierarchical emulation engine 124 performs the operations at blocks 512-514 through invocation of a script in a new process. Further details regarding the determination of the response at block 512 are provided below with reference to FIG. 6.

In addition to providing a response to the communication packet, hierarchical emulation engine 124 may also optionally inject a desired state into system model 128, for example, based on one or more received communication packets, or alternatively, independently of any received communication packets (block 516). In one use case, the state may be an error state of the target hardware system. In another use case, the state may be a non-error state of the target hardware system. Hierarchical emulation engine 124 may inject the desired state, for example, based on a predetermined rule specified by the script implementing hierarchical emulation engine 124 or in response to user input prompted by hierarchical emulation engine 124. Thus, in one use case, injection may be utilized to cycle the modeled hardware system through its error and/or non-error states in a predetermined order, in a random order, in a sequence determined based on one or more received communication packets, etc.

Following optional block 516, hierarchical emulation engine 124 determines at block 518 whether or not an input has been received (e.g., from emulator 122) that terminates emulation. If not, the process returns to block 510, which depicts hierarchical emulation engine 124 continuing to monitor for receipt of additional communication packets. In response to a determination at block 516 that an input terminating emulation has been received, the process of FIG. 5 ends at block 520.

Although not explicitly illustrated in FIG. 5, it will be understood by those skilled in the art that hierarchical emulation engine 124 may concurrently service multiple communication packets through the execution of multiple concurrent processes.

Figure 6:
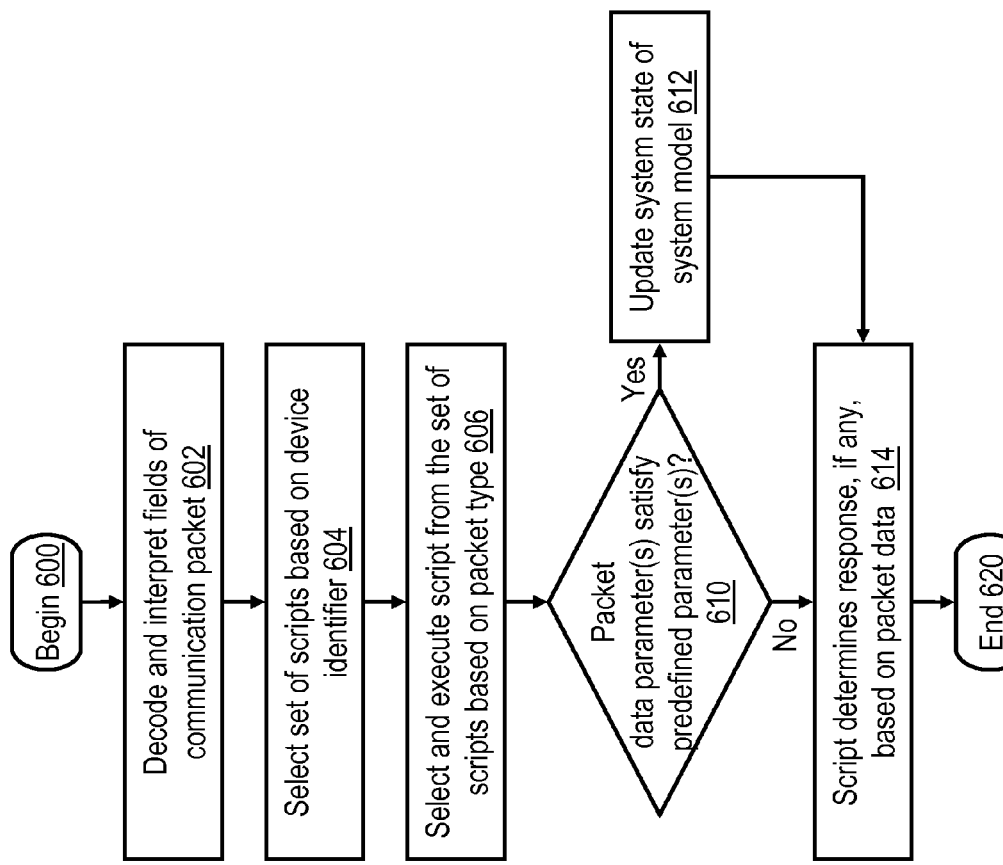
FIG. 6 is a high level logical flowchart of an exemplary method of determining a response to a communication packet in the method of FIG. 5.

Referring now to FIG. 6, there is depicted a high level logical flowchart of an exemplary method of determining a response to a communication packet in the method of FIG. 5. As noted above, the process of FIG. 6 is performed at block 512 of FIG. 5.

The process of FIG. 6 begins at block 600 in response to receipt by hierarchical emulation engine 124 of a communication packet from pluggable emulated device 126 via emulated bus 302. The process then proceeds from block 600 to block 602, which illustrates hierarchical emulation engine 124 decoding and interpreting the various fields of the communication packet, including device identifier field 402, packet type field 404 and packet data field 406. Utilizing the device identifier specified in device identifier field 402 of the communication packet as a key, hierarchical emulation engine 124 traverses from the root system directory in which it resides to file system level 1 to file system level 2. In so doing, hierarchical emulation engine 124 selects a set of scripts associated with the hardware component based on the device identifier (block 604).

As shown at block 606, hierarchical emulation engine 124 selects one of the scripts from the set of scripts selected at block 604 based on the packet type indicated by packet type field 404 of the communication packet. Hierarchical emulation engine 124 then launches execution of the selected script, preferably in a new process, and passes the script one or more packet data parameters determined at block 602. The script then parses the packet data parameter(s) and determines whether or not the packet data parameter(s) satisfy (e.g., match, fall within, exceed or are less than) predefined parameters that require special handling (block 610). If not, the processing of the script continues at block 614, which is described below. If, however, the script determines at block 610 that the packet data parameter(s) satisfy the predetermined parameters, the script interprets that packet data parameter(s) and performs the action defined in the script to update the system state of system model 128. In this manner, the effects of a series of communication packets that are interdependent can be properly emulated. The process then proceeds from block 612 to block 614.

At block 614, the script traverses from file system hierarchy level 2 to file system hierarchy level 3 to locate a set of possible responses 310 that it can provide to the communication packet. Based on the packet data parameters received from hierarchical emulation engine 124, the script selects a response from the set of possible responses. Thereafter, the process of FIG. 6 ends at block 620. The script then upwardly traverses the file system hierarchy to return the response to hierarchical emulation engine 124, which provides the selected response to the pluggable emulated device 126 as depicted at block 514 of FIG. 5 and as discussed above.

It should be appreciated that one benefit of the hierarchical emulation architecture 300 disclosed herein and the associated processes illustrated in FIGS. 5-6 is that a user can readily modify the behavior of system model 128 during emulation by modifying any desired granularity of data within system model 128. For example, the user can modify all device containers, one device container, one or more scripts in a device container, and/or the data associated with the various responses. According to one emulation protocol, a library of known system states can be obtained, for example, from developer definitions or through system snapshots. The user can easily and directly configure system model 128 in any of (or a sequence of) these various system states by modifying components of hierarchical emulation architecture 300 while hierarchical emulation engine 124 and pluggable emulated device 126 are running (and without restart). The freely customizable nature of system model 128 is particularly enabled by the use of scripts, which execute independent from and outside the context of hierarchical emulation engine 124, meaning that the scripts, responses, and associated packet data can be modified or swapped without restart of hierarchical emulation engine 124 or emulator 122.

Heretofore, embodiments have been described in which one hardware component of the target hardware system is selected as a point of perspective and is represented in hierarchical emulation environment 300 by a pluggable emulated device 126 that is executed by a possibly conventional emulator 122, such as QEMU. In such embodiments, pluggable emulated device 126 is fully emulated, meaning that emulator 122 represents the specific logic circuitry, signals, registers, functions and communications of the internal functional units of the selected hardware component in the execution of pluggable emulated device 126.

However, in at least some cases, the development time and cost required to achieve a fully emulated hardware design may be unwarranted and/or unavailable. This limitation in development time and/or cost is particularly likely to arise in the development of target hardware systems including intelligent subsystems and/or hardware components that form multiple independent decision points because, in such cases, the presence of multiple independent decision points in the system creates an exponentially greater number of possible component interactions. Because of the challenge in creating the fully emulated hardware design, other development efforts, such as development of firmware or software, can be undesirably serialized and delayed until after the development of the fully emulated hardware design.

In order to allow parallelization of development efforts (e.g., of hardware and software/firmware designs), in at least some embodiments it is desirable to perform lightweight modeling of hardware components of a target hardware system rather than full emulation, while extending the scope of such modeling beyond that implemented by hierarchical emulation engine 124. With reference now to FIG. 7, there is illustrated a block diagram of an exemplary development environment 700 in accordance with one embodiment.

Development environment 700 includes a host application 702, which can be, for example, software and/or firmware under development. Host application 702 can run, for example, as a process on data processing system 100. In some implementations, host application 702 controls a management component, for example, flash controller 204 or CPU 208 of data storage system 200, that manages one or other hardware components of the target hardware system.

Development environment 700 further includes a component model 704 that models a selected hardware component of a target hardware system. In some implementations, component model 704 models a management component that manages one or other hardware components, for example, flash controller 204 or CPU 208 of data storage system 200, and may, in fact, represent the underlying hardware on which host application 702 is intended to execute. In other implementations, component model 704 models a managed component, such as a flash memory modules 220, and host application 702 can provide the functionality of the managed component. Component model 704 can preferably be brought up independently from host application 702 in order to accurately represent behavior in the target hardware system in which hardware components are brought up at different times, fail and/or are replaced. In contrast to a fully emulated virtual representation such as a pluggable emulated device 126, component model 704 represents the selected hardware component in a lightweight manner utilizing three components, namely, a register interface 706, parameter registers 708, and state machine 710. In this lightweight representation, component model 704 need not, and preferably does not, execute within a simulator environment. Further, component model 704 preferably models the state and behavior of the corresponding hardware component without explicitly emulating the logic implemented in the corresponding hardware component.

Register interface 706 is an interface that can be written and read by host application 702. For example, host application 702 can utilize register interface 706 to read and write specific registers to read and write state data to and from component model 704 and to request performance of various actions by component model 704. In a preferred embodiment, the number of registers modeled by register interface 706 is freely modifiable, such that virtual registers can be dynamically added or removed as needed or desired during emulation.

Parameter registers 708 are a collection of state information representing the current state of component model 704. The state information within parameter registers 708 can be persistent or non-persistent. As indicated in FIG. 7, parameter registers 708 are communicatively coupled to register interface 706 to permit the state of component model 704 to be read or set via register interface 706 in the same manner as the state of the corresponding hardware component.

State machine 710 represents the core functionality of the hardware component modeled by component model 704 based on the state indicated parameter registers 708. As indicated in FIG. 7, state machine 710 is communicatively coupled to register interface 706 to enable one or more functions of state machine 710 to be invoked (including an update to parameter register 708) via register interface 706 in the same manner as the corresponding hardware component.

Development environment 700 additionally includes a control and injection engine (CIE) 712, which can be implemented, for example, as a script that executes on data processing system 100 in a different process from host application 702 and component model 704. CIE 712 is communicatively coupled to parameter registers 708 and state machine 710 in order to modify the behavior of component model 704 to inject specific states, for example, by dynamically setting values of static or dynamic variables in parameter registers 708 during execution of component model 704. Thus, in one use case, CIE 712 can inject errors in component model 704 to enable testing of error handling by host application 702 without requiring the error states to be produced by physical or emulated hardware.

Figure 8:
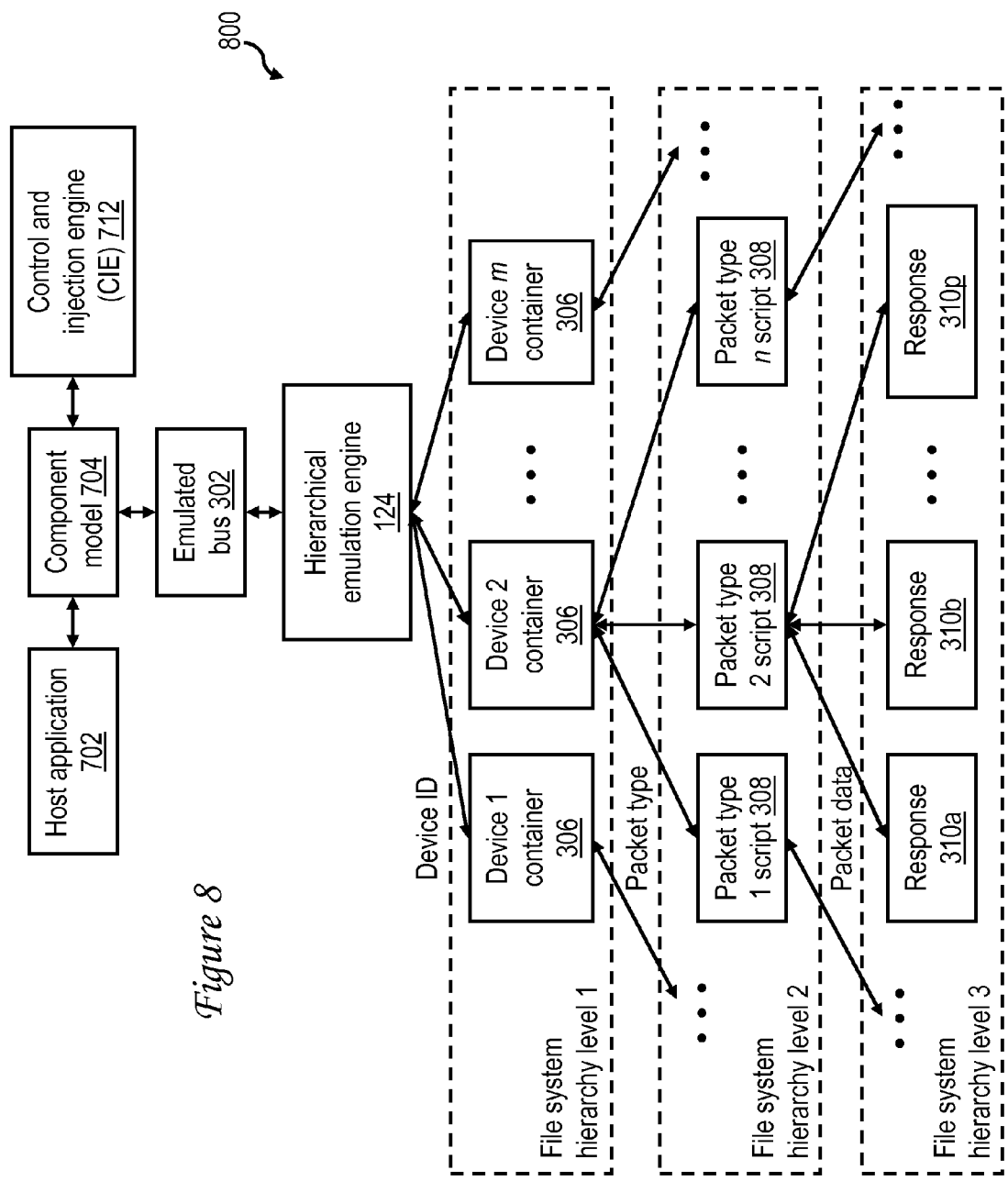
FIG. 8 illustrates another exemplary hierarchical emulation architecture including a component model in lieu of a fully emulated pluggable device in accordance with one embodiment.

Referring now to FIG. 8, there is depicted another exemplary hierarchical emulation architecture 800 in which like reference numerals are utilized to denote like and corresponding features to the hierarchical emulation architecture 300 given in FIG. 3. Hierarchical emulation architecture 800 illustrates that a component model 704 can be employed in lieu of a fully emulated pluggable device 126 to enable a lighter weight modeling of the target hardware system. In such implementations, component model 704 is communicatively coupled with a host application 702 and a CIE 712 as described above with reference to FIG. 7. The remainder of hierarchical emulation architecture 800 can advantageously remain as described above with reference to FIGS. 3-6.

Figure 9:
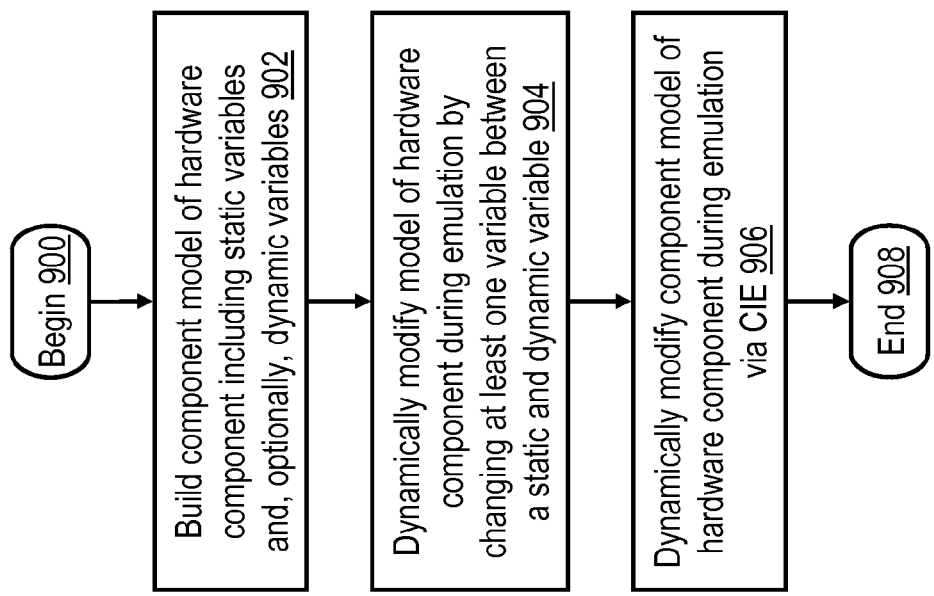
FIG. 9 is a high level logical flowchart of an exemplary method of modeling a hardware component in accordance with one embodiment.

With reference now to FIG. 9, there is illustrated a high level logical flowchart of an exemplary method of modeling a hardware component of a target hardware system in accordance with one embodiment. In at least some embodiments, the illustrated process can be performed by data processing system 100 through the execution of hierarchical emulation engine 124, host application 702, component model 704 and CIE 712 in four different processes to permit their independent execution.

The process of FIG. 9 begins at block 900 and then proceeds to block 902, which illustrates the step of building a component model 704 corresponding to a selected hardware component of the target hardware system. The component model 704 will include a register interface 706, parameter registers 708 and a state machine 710 as shown in FIG. 7. As noted above, in the exemplary data storage system 200 of FIG. 2, the selected hardware component may be, for example, a module 220 of NAND flash memory array 212.

In a preferred embodiment, component model 704 can be built up dynamically during execution, for example, in development environment 700 or hierarchical emulation architecture 800. That is, component model 704 can initially model the hardware component very simply with one or more static variables and, optionally, one or more dynamic variables within parameter registers 708. The static variables can include, for example, a static variable such as PowerState=ON, that permits host application 702 to register the presence of a modeled hardware component. As indicated at block 904, during model execution, the static variable(s) can be augmented with, or converted into, dynamic variables and, if desired, one or more dynamic variable can also be converted to static variables. It should be noted that the modification of component model 704 illustrated at block 904 is not a modification of the value of a state variable of component model 704 (e.g., an update to the values stored in parameter registers 708, such as changing PowerState from ON to OFF), but is instead a modification of the model itself. The dynamic modification depicted at block 904 can include dynamic modification to register interface 706, for example, to add or delete registers that can read and/or written, to modify whether a register is read-only, write-only or both read and write, to change legal variable types of such registers (e.g., numeric, string, Boolean, etc.), etc. The dynamic modification shown at block 904 can alternatively or additionally include modification of parameter registers 708, for example, to add or delete parameter registers 708, to change state variables held in parameter registers 708 between static and dynamic (as noted above), to change legal variable types of parameter registers 708 (e.g., numeric, string, Boolean, etc.), etc. The dynamic modification depicted at block 904 can alternatively or additionally include modification of state machine 710, for example, to add and/or delete error and/or non-error states of component model 704, to modify transitions between such states, to modify state variable values that trigger state changes, etc.

As indicated at block 906, during model execution, CIE 712 may change the values of parameter registers 708 or modify state machine 710. CIE 712 may modify component model 704 in either of these ways in an automated fashion, for example, by reference to a rule set implemented by the script utilized to implement CIE 712, or in an interactive fashion that solicits user-level input(s). As noted above, a particular useful application of the dynamic modifications made by CIE 712 is to model various error states to be handled by host application 702. At the termination of model execution, the process of FIG. 9 ends at block 908.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As has been described, in one embodiment a hierarchy in a data storage system, such as a file system or database hierarchy, is utilized to organize a hierarchical arrangement of device containers corresponding to various device identifiers of the plurality of hardware components in the target hardware system, scripts corresponding to various packet types of communication packets in the target hardware system, and responses corresponding to various packet data in the communication packets in the target hardware system. In response to receipt by a hierarchical emulation engine of a communication packet during emulation of the target hardware system, the communication packet including a device identifier, packet type and packet data, a response to the communication packet is determined by traversing the hierarchical arrangement based on the device identifier, packet type and packet data of the communication packet. The determined response is then provided.

In at least one embodiment, to emulate a hardware component of a target hardware system including a plurality of hardware components, a component model of the hardware component is built, where the component model includes a register interface through which a host application provides inputs to and reads outputs from the component model, one or more parameter registers that hold values of state variables of the component model, and a state machine that models behavior of the hardware component without explicitly emulating logic implemented in the hardware component. During modeling of the hardware component utilizing the component model the component model is dynamically modified other than by modifying values of the state variables.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude transitory propagating signals per se.

What is claimed is:

1. A method of emulating a hardware component of a target hardware system including a plurality of hardware components, the method comprising:
   a processor building a component model of the hardware component of the target hardware system, wherein the component model includes:
      a register interface through which a host application provides inputs to and reads outputs from the component model;
      one or more parameter registers that hold values of state variables of the component model; and
      a state machine that models behavior of the hardware component without explicitly emulating logic implemented in the hardware component;
   the processor modeling operation of the hardware component utilizing the component model;
   during the modeling, the processor dynamically modifying the component model other than by modifying values of the state variables; and
   the processor emulating other of the plurality of hardware components of the target hardware system by:
      in a data storage system, utilizing a hierarchical data structure to organize a hierarchical arrangement of device containers corresponding to various device identifiers of the plurality of hardware components in the target hardware system, scripts corresponding to various packet types of communication packets in the target hardware system, and responses corresponding to various packet data in the communication packets in the target hardware system;
      in response to receipt by a hierarchical emulation engine of a communication packet during emulation of the target hardware system, the communication packet including a device identifier, packet type and packet data, determining a response to the communication packet by traversing the hierarchical arrangement based on the device identifier, packet type and packet data of the communication packet; and
      providing the determined response.

2. The method of claim 1, and further comprising:
   the processor executing a control and injection engine to inject a desired state directly into one or more of the parameter registers and the state machine rather than through the register interface.

3. The method of claim 1, wherein the dynamically modifying includes dynamically modifying the register interface.

4. The method of claim 1, wherein the dynamically modifying includes dynamically modifying a variable type of state variable held in a parameter register.

5. The method of claim 1, wherein the dynamically modifying includes dynamically modifying the state machine.

6. A program product, comprising:
   a non-transitory storage device; and
   program code stored in the storage device and executable by a processor to cause a data processing system to perform:
      building a component model of the hardware component of the target hardware system, wherein the component model includes:
         a register interface through which a host application provides inputs to and reads outputs from the component model;
         one or more parameter registers that hold values of state variables of the component model; and
         a state machine that models behavior of the hardware component without explicitly emulating logic implemented in the hardware component;
      modeling operation of the hardware component utilizing the component model;
      during the modeling, dynamically modifying the component model other than by modifying values of the state variables; and
      emulating other of the plurality of hardware components of the target hardware system by:
         in a data storage system, utilizing a hierarchical data structure to organize a hierarchical arrangement of device containers corresponding to various device identifiers of the plurality of hardware components in the target hardware system, scripts corresponding to various packet types of communication packets in the target hardware system, and responses corresponding to various packet data in the communication packets in the target hardware system;
         in response to receipt by a hierarchical emulation engine of a communication packet during emulation of the target hardware system, the communication packet including a device identifier, packet type and packet data, determining a response to the communication packet by traversing the hierarchical arrangement based on the device identifier, packet type and packet data of the communication packet; and
         providing the determined response.

7. The program product of claim 6, wherein the program code further causes the data processing system to perform:
   injecting a desired state directly into one or more of the parameter registers and the state machine rather than through the register interface.

8. The program product of claim 6, wherein the dynamically modifying includes dynamically modifying the register interface.

9. The program product of claim 6, wherein the dynamically modifying includes dynamically modifying a variable type of state variable held in a parameter register.

10. The program product of claim 6, wherein the dynamically modifying includes dynamically modifying the state machine.

11. A data processing system, comprising:
    a processor;
    a storage device coupled to the processor; and
    program code stored in the storage device and executable by the processor to cause the data processing system to perform:
       building a component model of the hardware component of the target hardware system, wherein the component model includes:
          a register interface through which a host application provides inputs to and reads outputs from the component model;

one or more parameter registers that hold values of state variables of the component model; and a state machine that models behavior of the hardware component without explicitly emulating logic implemented in the hardware component;

modeling operation of the hardware component utilizing the component model;

during the modeling, dynamically modifying the component model other than by modifying values of the state variables; and emulating other of the plurality of hardware components of the target hardware system by:

in a data storage system, utilizing a hierarchical data structure to organize a hierarchical arrangement of device containers corresponding to various device identifiers of the plurality of hardware components in the target hardware system, scripts corresponding to various packet types of communication packets in the target hardware system, and responses corresponding to various packet data in the communication packets in the target hardware system;

in response to receipt by a hierarchical emulation engine of a communication packet during emulation of the target hardware system, the communication packet including a device identifier, packet type and packet data, determining a response to the communication packet by traversing the hierarchical arrangement based on the device identifier, packet type and packet data of the communication packet; and providing the determined response.

12. The data processing system of claim 11, wherein the program code further causes the data processing system to perform:

injecting a desired state directly into one or more of the parameter registers and the state machine rather than through the register interface.

13. The data processing system of claim 11, wherein the dynamically modifying includes dynamically modifying the register interface.

14. The data processing system of claim 11, wherein the dynamically modifying includes dynamically modifying a variable type of state variable held in a parameter register.

15. The data processing system of claim 11, wherein the dynamically modifying includes dynamically modifying the state machine.

* * * * *